United States Patent
Wei et al.

(10) Patent No.: US 7,480,159 B2
(45) Date of Patent: Jan. 20, 2009

(54) SWITCHING-MODE POWER CONVERTER AND PULSE-WIDTH-MODULATION CONTROL CIRCUIT WITH PRIMARY-SIDE FEEDBACK CONTROL

(75) Inventors: Da-Chun Wei, Hsin-Chu (TW); Yuan-Wen Chang, Hsin-Chu (TW)

(73) Assignee: Leadtrend Technology Corp., Hsin-Chu (TW)

( * ) Notice: Subject to any disclaimer, the term of this patent is extended or adjusted under 35 U.S.C. 154(b) by 113 days.

(21) Appl. No.: 11/737,722

(22) Filed: Apr. 19, 2007

(65) Prior Publication Data

US 2008/0259655 A1 Oct. 23, 2008

(51) Int. Cl.
 *H02M 3/335* (2006.01)
 *H02M 3/24* (2006.01)
(52) U.S. Cl. ................. 363/21.18; 363/21.1; 363/21.17
(58) Field of Classification Search ............... 363/21.12, 363/21.16, 21.17, 21.18, 21.08, 21.09, 21.01, 363/21.11, 95, 97, 131
See application file for complete search history.

(56) References Cited

U.S. PATENT DOCUMENTS

| | | | | |
|---|---|---|---|---|
| 5,359,281 | A * | 10/1994 | Barrow et al. | 323/284 |
| 5,502,370 | A * | 3/1996 | Hall et al. | 323/284 |
| 6,343,026 | B1 * | 1/2002 | Perry | 363/65 |
| 6,756,771 | B1 * | 6/2004 | Ball et al. | 323/222 |
| 6,836,415 | B1 * | 12/2004 | Yang et al. | 363/21.01 |
| 6,894,911 | B2 * | 5/2005 | Telefus et al. | 363/97 |
| 7,027,313 | B2 * | 4/2006 | Amei | 363/21.12 |
| 7,400,517 | B2 * | 7/2008 | Allinder | 363/21.05 |

* cited by examiner

*Primary Examiner*—Bao Q Vu
(74) *Attorney, Agent, or Firm*—Winston Hsu (57) ABSTRACT

A pulse-width-modulation control circuit of a switching-mode power converter with a primary-side feedback control is disclosed. The switching-mode power converter includes a transformer, a power switch, a current sensing resistor and the pulse-width-modulation control circuit. The transformer includes a primary-side winding, a secondary-side winding and an auxiliary winding. The pulse-width-modulation control circuit includes a sample and hold circuit, a transconductor circuit, an error amplifier and a pulse-width-modulation generator.

14 Claims, 5 Drawing Sheets

SWITCHING-MODE POWER CONVERTER AND PULSE-WIDTH-MODULATION CONTROL CIRCUIT WITH PRIMARY-SIDE FEEDBACK CONTROL

BACKGROUND OF THE INVENTION

1. Field of the Invention

The present invention relates to a switching-mode power converter and a pulse-width-modulation (PWM) control circuit, and more particularly, to a switching-mode power converter with a primary-side feedback control and PWM control circuit thereof.

2. Description of the Prior Art

Figure 1:
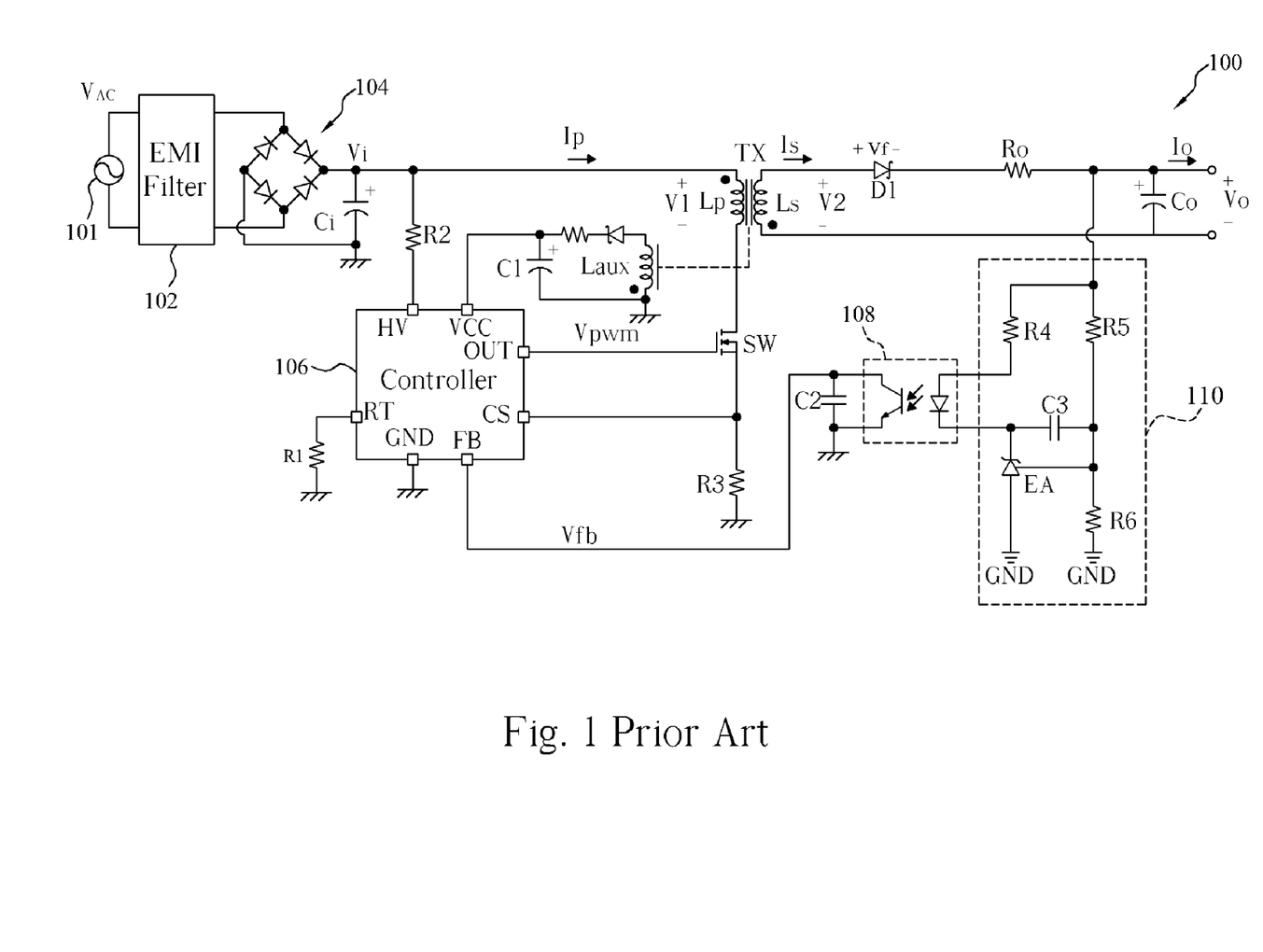
FIG. 1 is a diagram of a conventional flyback converter.

Please refer to FIG. 1. FIG. 1 is a diagram of a conventional flyback converter 100. An AC voltage $V_{AC}$ provided from an AC voltage source 101 is filtered and rectified respectively by an Electro-Magnetic Interference (EMI) filter 102 and a bridge rectifier 104, and a DC input voltage Vi having ripples is then obtained. The DC input voltage Vi is coupled to a primary-side winding Lp of a transformer TX, and a power switch SW is connected to the primary-side winding Lp of the transformer TX in series. A controller 106 is utilized for outputting a pulse-width-modulation signal Vpwm to turn on/off the power switch SW, for transforming the input voltage Vi into an output voltage Vo on the secondary-side of the transformer TX. A resistor R3 is connected to the primary-side winding Lp of the transformer TX in series and utilized for detecting a primary side-winding current Ip. In order to regulate the output voltage Vo, a voltage regulator 110 and an optical coupler 108 are utilized for generating a feedback signal Vfb proportional to the output voltage Vo into the controller 106 from the second-side winding of the transformer TX. The controller 106 then controls a duty cycle of the pulse-width-modulation signal Vpwm according to the feedback signal Vfb and primary-side winding current Ip such that regulation of the output voltage Vo is achieved.

Although the above-mentioned output voltage Vo can be precisely regulated by the flyback converter 100, the production cost will be much higher due to the required control circuit with a secondary-side feedback control.

SUMMARY OF THE INVENTION

It is therefore one of the objectives of the present invention to provide a switching-mode power converter and related PWM control circuit with primary-side feedback control, where the switching-mode power converter and PWM control circuit have low cost.

According to embodiments of the claimed invention, a PWM control circuit applied to a switching-mode power converter with a primary-side feedback control is disclosed. The switching-mode power converter comprises a transformer, a power switch, a current sensing resistor, and the PWM control circuit. The transformer includes a primary-side winding, a secondary-side winding, and an auxiliary winding, where a voltage from the auxiliary winding is rectified for outputting a DC feedback voltage. The power switch is connected to the primary-side winding in series and turned on/off by a PWM signal generated from the PWM control circuit. The current sensing resistor is positioned between the power switch and ground level and is utilized for transforming a current passing through the primary-side winding into a sensing voltage.

In a first embodiment of the claimed invention, the PWM control circuit comprises a sample and hold circuit, a transconductor circuit, an error amplifier, and a PWM generator. The sample and hold circuit samples the sensing voltage for a peak value and then maintains the peak value of the sensing voltage at an output terminal of the sample and hold circuit. The transconductor circuit is coupled to the output terminal of the sample and hold circuit and is utilized for transforming the peak value of the sensing voltage into a current signal. The error amplifier has two input terminals, where one of the input terminals is coupled to the current signal and the feedback voltage and the other of the input terminals is coupled to a fixed reference voltage. The error amplifier is utilized for generating an error signal. The PWM generator is utilized for determining a duty cycle of the PWM signal according to the error signal.

In a second embodiment of the claimed invention, the PWM control circuit comprises a first sample and hold circuit, a second sample and hold circuit, an operation processing unit, a transconductor circuit, an error amplifier, and a PWM generator. The first sample and hold circuit is utilized for sampling the sensing voltage for a peak value and then maintaining the peak value of the sensing voltage at an output terminal of the first sample and hold circuit. The second sample and hold circuit is utilized for sampling the sensing voltage for an initial value and then maintaining the initial value of the sensing voltage at an output terminal of the second sample and hold circuit. The operation processing unit is utilized for subtracting the initial value from the peak value of the sensing voltage to generate an amount of change in the sensing voltage. The transconductor circuit is coupled to an output terminal of the operation processing unit and utilized for transforming the amount of change in the sensing voltage into a current signal. The error amplifier has two input terminals, where one of the input terminals is coupled to the current signal and the feedback voltage and the other of the input terminals is coupled to a fixed reference voltage. The error amplifier is utilized for generating an error signal. The PWM generator is utilized for determining a duty cycle of the PWM signal according to the error signal.

These and other objectives of the present invention will no doubt become obvious to those of ordinary skill in the art after reading the following detailed description of the preferred embodiment that is illustrated in the various figures and drawings.

DETAILED DESCRIPTION

Figure 2A:
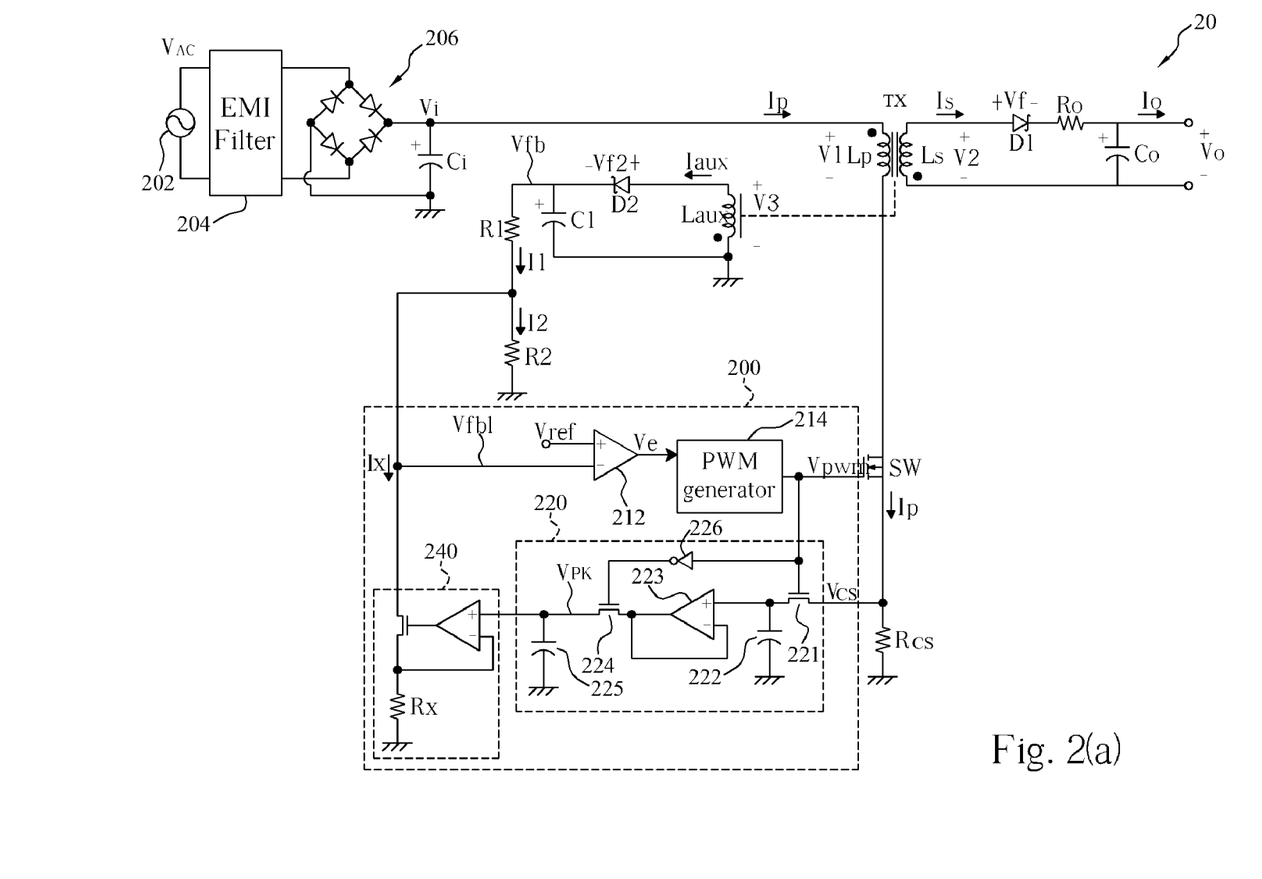
FIG. 2(a) is a diagram of a switching-mode power converter according to a first embodiment of the present invention.

FIG. 2(a) is a diagram of a switching-mode power converter 20 according to a first embodiment of the present invention. An AC voltage $V_{AC}$ provided from an AC voltage source 202 is respectively filtered and rectified by an EMI filter 204 and a bridge rectifier 206, for generating a DC input voltage Vi. The DC input voltage Vi is coupled to a primary-side winding Lp of a transformer TX, and a power switch SW is connected to the primary-side winding Lp of the transformer TX in series. A PWM generator 214 is utilized for generating a PWM signal Vpwm to turn on/off the power switch SW, for transforming the input voltage Vi into an output voltage Vo.

Figure 2B:
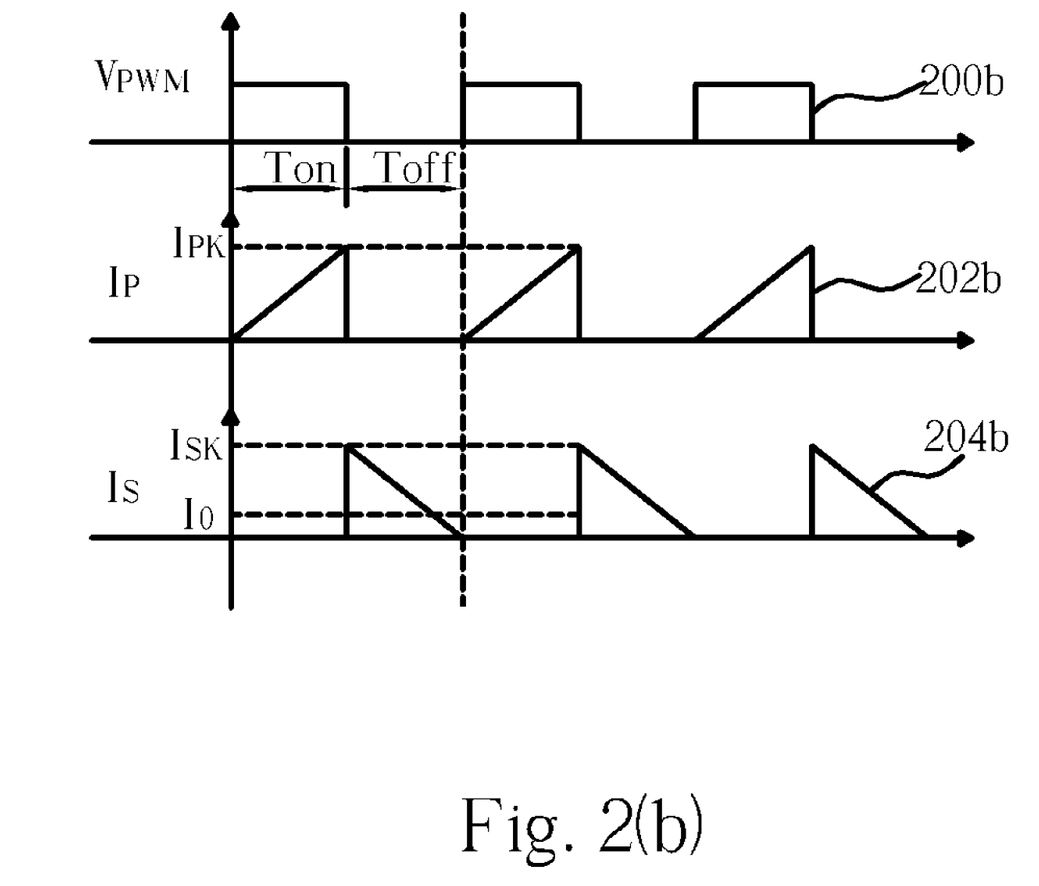
FIG. 2(b) is a waveform diagram illustrating a PWM signal, a primary-side winding current, and a secondary-side winding current shown in FIG. 2(a).

FIG. 2(*b*) is a waveform diagram illustrating the PWM signal Vpwm, a primary-side winding current Ip, and a secondary-side winding current Is shown in FIG. 2(*a*) when the switching-mode power converter 20 operates in Discontinuous Conduction Mode (DCM). As shown in FIG. 2(*b*), waveforms 200*b*, 202*b*, and 204*b* are representative of the PWM signal Vpwm, the primary-side winding current Ip, and the secondary-side winding current Is respectively. During an on-duty period Ton of the PWM signal Vpwm, the power switch SW is conductive and the primary-side winding current Ip increases gradually from zero to a peak value $I_{PK}$. The primary-side winding Lp therefore stores energy, which can be illustrated by the following equation:

$$\frac{1}{2} Lp \times I_{PK}^2 = \frac{1}{2} Lp \left(\frac{V1}{Lp} \times Ton\right)^2 \quad \text{Equation (1)}$$
$$= \frac{1}{2} \times \frac{V1^2}{Lp} \times Ton^2$$

wherein the parameter V1 is meant to be a voltage drop across the primary-side winding Lp. During an off-duty period Toff of the PWM signal Vpwm, the power switch SW is turned off and energy stored in the primary-side winding Lp is transferred to the secondary-side winding Ls. Accordingly, the secondary-side winding current Is will decrease gradually from a peak value $I_{SK}$ to zero. A diode D1 connected to the secondary-side winding Ls is utilized for rectification, and a forward voltage of the diode D1 is equal to Vf. A resistor Ro is an output resistor on the secondary-side of the switching-mode power converter 20, and a current Io is meant to be an average current provided from the secondary-side winding current Is (i.e. the current Io is a secondary-side average current). A voltage drop across an output capacitor Co is intended to be an output voltage Vo. During the off-duty period Toff of the PWM signal Vpwm, energy consumed by the diode D1, resistor Ro, and the output capacitor Co on the secondary-side of the transformer TX is shown in the following equation:

$$Vo \times Io \times Toff + Io^2 \times Ro \times Toff + Io \times Vf \times Toff \quad \text{Equation (2)}$$

Actually, energy stored in the primary-side winding Lp is transferred to the secondary-side winding Ls and an auxiliary winding Laux on the primary-side, but little energy is consumed by the auxiliary winding Laux and therefore can be omitted. Equation (1) is equivalent to Equation (2), so the following equation is derived from Equation (1) and Equation (2) divided by Toff respectively:

$$Vo \times Io + Io^2 \times Ro + Io \times Vf = \frac{1}{2} \times \frac{V1^2}{Lp} \times \frac{Ton^2}{Toff} \quad \text{Equation (3)}$$

Additionally, a voltage drop across the secondary-side winding Ls can be shown in the following equation:

$$V2 = Vo + Io \times Ro + Vf \quad \text{Equation (4)}$$

By using Equation (3) divided by Io in substitution for Equation (4), Equation (5) is illustrated as the following equation:

$$V2 = Vo + Io \times Ro + Vf \quad \text{Equation (5)}$$
$$= \frac{1}{2} \times \frac{V1^2}{Lp} \times \frac{Ton^2}{Toff} \times \frac{1}{Io}$$

According to Equation (5), when the secondary-side average current Io increases due to an increase of load, the voltage drop V2 across the secondary-side winding Ls and the output voltage Vo will decrease. Otherwise, if the secondary-side average current Io decreases, the voltage drop V2 across the secondary-side winding Ls and the output voltage Vo will increase.

The auxiliary winding Laux is positioned on the primary-side of the transformer TX, where a capacitor C1 is charged by an auxiliary winding current Iaux rectified through a diode D2 and then a DC feedback voltage Vfb is generated. A voltage drop across the auxiliary winding Laux can be shown by the following equation:

$$V3 = Vf2 + Vfb \quad \text{Equation (6)}$$

wherein the voltage Vf2 is a forward voltage of the diode D2. It is assumed that a turns ratio of the winding Lp, Ls, and Laux is n1:n2:n3. Accordingly, the secondary-side winding voltage can be shown as follows:

$$V2 = (n2/n3) \times V3 = N \times V3 \quad \text{Equation (7)}$$

The parameter N is a turns ratio of the secondary-side winding Ls to the auxiliary winding Laux.

Resistors R1 and R2 are connected in series and can be regarded as a resistor voltage divider. A voltage drop Vfb1 across the resistor R2 can be shown as follows:

$$Vfb1 = Vfb \times [R2/(R1+R2)]$$

A current sensing resistor $R_{CS}$ is connected to the primary-side winding Lp in series and capable of transforming the primary-side winding current Ip into a sensing voltage $V_{CS}$.

The PWM control circuit 200 comprises a sample and hold circuit 220, a transconductor circuit 240, an error amplifier 212, and a PWM generator 214. The sample and hold circuit 220 includes MOS transistors 221 and 224, capacitors 222 and 225, a buffer 223, and an inverter 226. When the PWM signal Vpwm is at a high logic level (e.g. the on-duty period Ton shown in FIG. 2(*b*)), the capacitor 222 is charged with the sensing voltage $V_{CS}$ since the transistor 221 is conductive. Otherwise, when the PWM signal Vpwm changes to a low logic level (e.g. the off-duty period Toff shown in FIG. 2(*b*)), the transistor 221 will not be conductive such that a sample voltage from the capacitor 222 is equal to the peak value $I_{PK}$ of the primary-side winding current Ip multiplied by the impedance of the current sensing resistor $R_{CS}$. That is, the sample voltage is a peak value $V_{PK}$ of the sensing voltage $V_{CS}$. The transistor 224 is then conductive and the peak value $V_{PK}$, which the capacitor 222 is charged by, is transmitted to the capacitor 225 via the buffer 223 and held by the capacitor 225. After the peak value $V_{PK}$ is converted through the transconductor circuit 240, which converts a voltage into a current, a current Ix is generated and can be illustrated by the following equation:

$$Ix = V_{PK}/Rx \quad \text{Equation (8)}$$

The error amplifier 212 has two input terminals, where an inverting input terminal is coupled to the current Ix and to a serial connection point between the resistors R1 and R2. A voltage Vfb1 at the serial connection point between the resistors R1 and R2 is proportional to the feedback voltage Vfb; a non-inverting input terminal of the error amplifier 212 is coupled to a fixed reference voltage Vref.

As shown in FIG. 2(a), a current I1 passing through the resistor R1 is the sum of a current I2 passing through the resistor R2 and the current Ix passing through the resistor Rx; the current I1 can be shown as follows:

$$I1=I2+Ix \quad \text{Equation (9)}$$

The feedback voltage Vfb subtracted by a voltage drop resulting from the current I1 passing through the resistor R1 is equal to the voltage Vfb1 at the inverting input terminal of the error amplifier 212, which can be described as follows:

$$Vfb-I1*R1=Vfb1 \quad \text{Equation (10)}$$

The voltage Vfb1 at the inverting input terminal of the error amplifier 212 is equal to the reference voltage Vref at the non-inverting input terminal of the error amplifier 212 after the whole feedback system is stable, where this equivalence can be shown in the following equation:

$$Vfb1=Vref \quad \text{Equation (11)}$$

As a result, by substituting Vref in Equation (11) and I2+Ix in Equation (9) for Vfb1 and I1 in Equation (10) respectively and according to the equation: I2=Vfb1/R2, the following equation can be derived:

$$Vfb=Vref*[1+(R1/R2)]+Ix*R1 \quad \text{Equation (12)}$$

It is also assumed that a forward voltage of the diode D1 is identical to that of the diode D2 (i.e. Vf=Vf2). From Equations (4), (6), and (7), the output voltage Vo can be explained as follows:

$$Vo=Vfb \times N+(N-1)Vf-Io \times Ro \quad \text{Equation (13)}$$

According to Equation (13), it is inferred that the output voltage Vo decreases as the secondary-side average current Io increases abruptly due to an increase of load. According to Equation (5), it can also be deduced that the voltage drop V2 across the secondary-side winding Ls decreases as the secondary-side average current Io increases abruptly due to an increase of load. Moreover, from Equation (6) and Equation (7), the feedback voltage Vfb will decrease; from Equation (10), the voltage Vfb1 at the inverting input terminal of the error amplifier 212 will also decrease. Consequently, an error value ΔVe occurs in an error signal Ve at an output terminal of the error amplifier 212. After detecting the error value ΔVe, the PWM generator 214 increases a duty cycle of the PWM signal Vpwm and then the primary-side winding current Ip also increases. Continuously, the sensing voltage $V_{CS}$ and the current Ix also increase; from Equation (12), it can be concluded that the voltage Vfb also increases. In addition, according to Equation (13), it can be deduced that the output voltage Vo also increases with an increase of the voltage Vfb and therefore a voltage decrease caused by an increase of the secondary-side average current Io can be counterpoised.

Figure 3A:
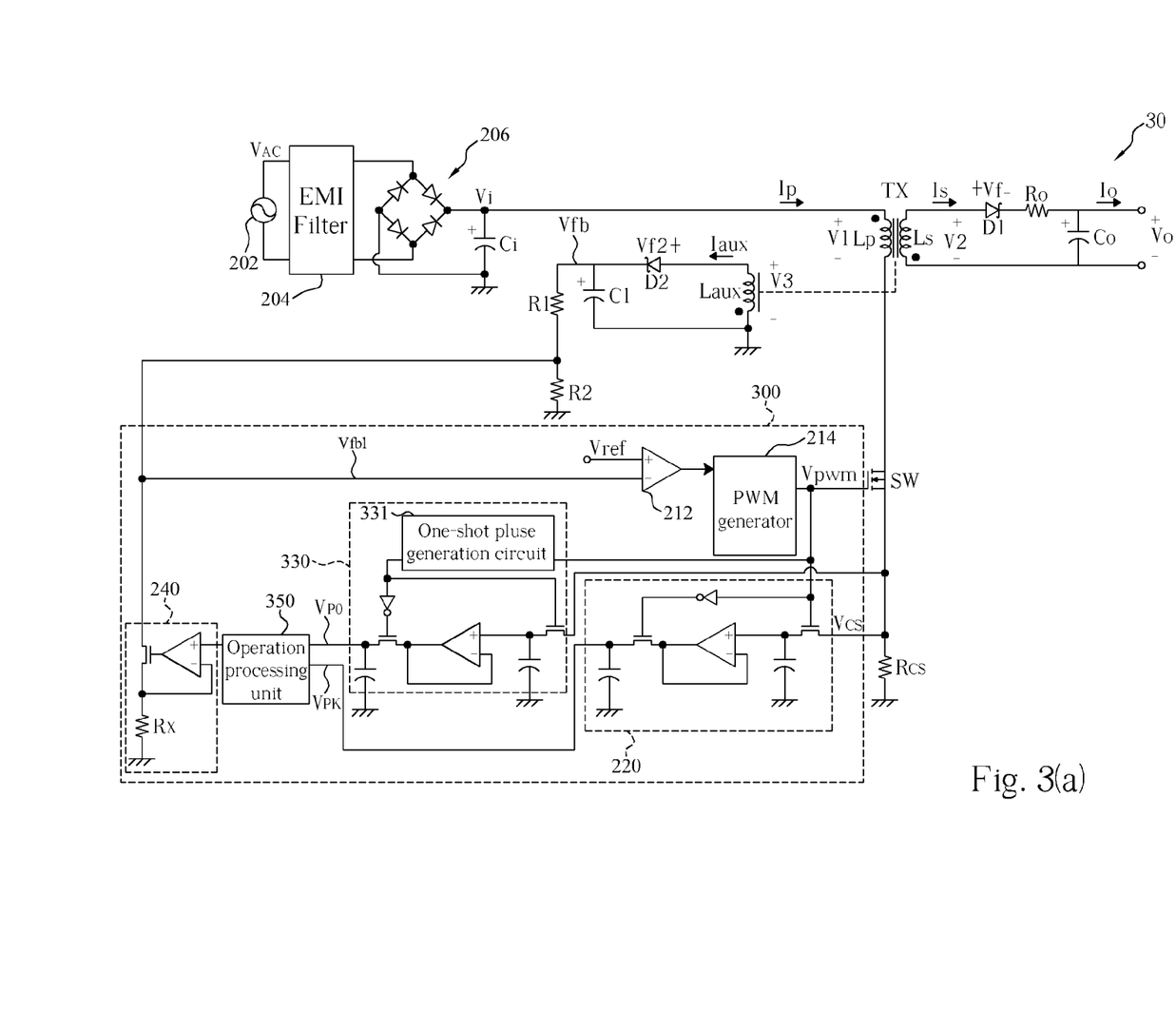
FIG. 3(a) is a diagram of a switching-mode power converter according to a second embodiment of the present invention.
Figure 3B:
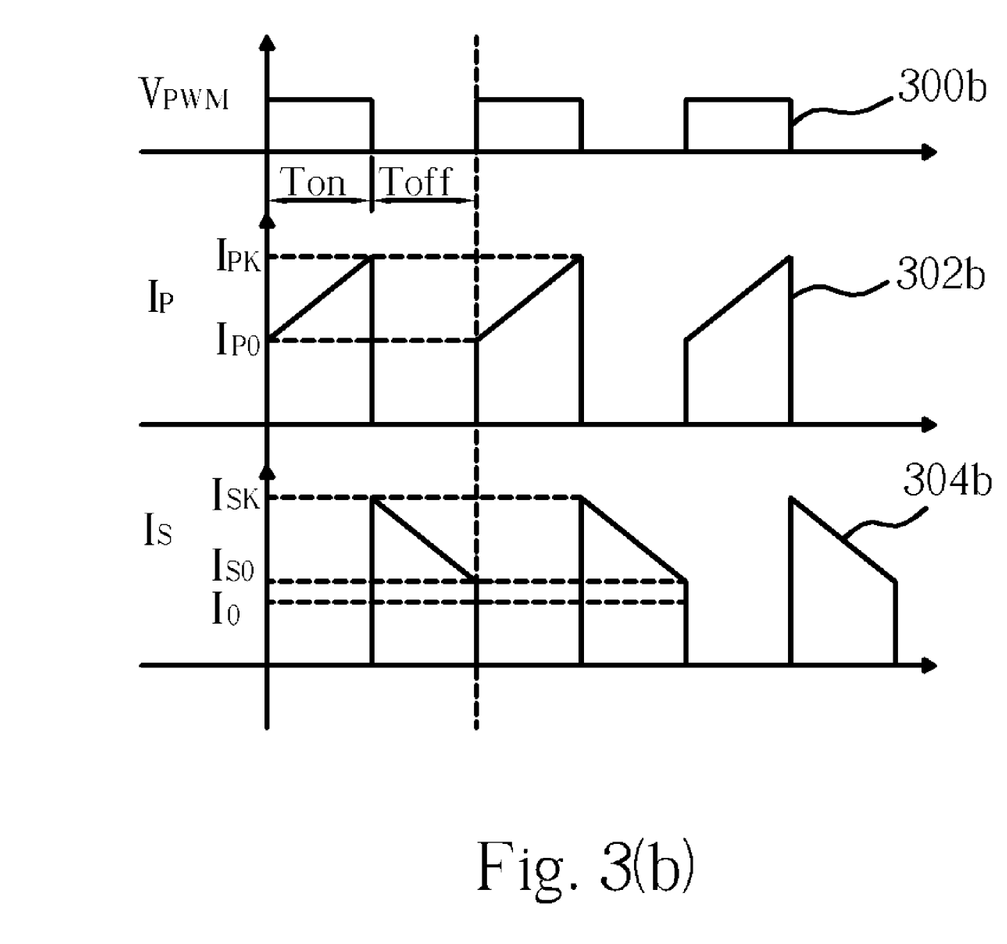
FIG. 3(b) is a waveform diagram showing a PWM signal, a primary-side winding current, and a secondary-side winding current shown in FIG. 3(a).

Please refer to FIG. 3(a) in conjunction with FIG. 3(b). FIG. 3(a) is a diagram of a switching-mode power converter 30 according to a second embodiment of the present invention. FIG. 3(b) is a waveform diagram showing a PWM signal Vpwm, a primary-side winding current Ip, and a secondary-side winding current Is shown in FIG. 3(a) when the switching-mode power converter 30 operates in Continuous Conduction Mode (CCM). As shown in FIG. 3(b), waveforms 300b, 302b, and 304b are representative of the PWM signal Vpwm, the primary-side winding current Ip, and the secondary-side winding current Is respectively. During an on-duty period Ton of the PWM signal Vpwm, a power switch SW is conductive and the primary-side winding current Ip increases gradually from an initial current $I_{P0}$ to a peak current $I_{PK}$.

During an off-duty period Toff of the PWM signal Vpwm, the power switch SW is turned off and energy stored in the primary-side winding Lp is transferred to the secondary-side winding Ls. Accordingly, the secondary-side winding current Is decreases gradually from a peak value $I_{SK}$ to an initial value $I_{SO}$.

Compared with the first embodiment, in the second embodiment of the present invention, the PWM control circuit 300 further comprises a sample and hold circuit 330 and an operation processing unit 350. A major difference between the sample and hold circuits 330 and 220 is that the sample and hold circuit 330 includes a one-shot pulse generation circuit 331. When the PWM signal Vpwm changes from the low logic level to the high logic level, a pulse generator 331 produces a short pulse, and the sample and hold circuit 330 samples the sensing voltage $V_{CS}$ for an initial value $V_{P0}$ by utilizing the short pulse, so as to maintain the initial value $V_{P0}$ of the sensing voltage $V_{CS}$ at the output terminal of the sample and hold circuit 330. The initial value $V_{P0}$ of the sensing voltage $V_{CS}$ is proportional to the initial current $I_{P0}$ shown in FIG. 3(b); the sample and hold circuit 220 in this embodiment is the same as that in the first embodiment and is utilized for outputting a peak value $V_{PK}$ of the sensing voltage $V_{CS}$ at its output terminal. The operation processing unit 350 is utilized for subtracting the initial value $V_{P0}$ from the peak value $V_{PK}$ of the sensing voltage $V_{CS}$ to generate an amount of change in the sensing voltage $V_{CS}$. The transconductor circuit 240 in the second embodiment is coupled to the output terminal of the operation processing unit 350 and utilized for transforming the amount of change in the sensing voltage $V_{CS}$ into a current Ix. In this embodiment, by transforming the amount of change in the sensing voltage $V_{CS}$ into the current Ix, high-precision control is more easily achieved when the switching-mode power converter operates in Continuous Conduction Mode.

Those skilled in the art will readily observe that numerous modifications and alterations of the device and method may be made while retaining the teachings of the invention.

What is claimed is:

1. A pulse-width-modulation (PWM) control circuit, being applied to a switching-mode power converter with a primary-side feedback control; the switching-mode power converter including a transformer, a power switch, a current sensing resistor, and the PWM control circuit; the transformer including a primary-side winding, a secondary-side winding, and an auxiliary winding, where a voltage from the auxiliary winding is rectified for outputting a DC feedback voltage; the power switch, connected to the primary-side winding in series, being turned on/off by a PWM signal generated from the PWM control circuit; the current sensing resistor, positioned between the power switch and a ground level, for transforming a current passing through the primary-side winding into a sensing voltage; the PWM control circuit comprising:

a sample and hold circuit, for sampling the sensing voltage for a peak value and maintaining the peak value of the sensing voltage at an output terminal of the sample and hold circuit;

a transconductor circuit, coupled to the output terminal of the sample and hold circuit, for transforming the peak value of the sensing voltage into a current signal;

an error amplifier having two input terminals, one of the input terminals being coupled to the current signal and the feedback voltage and another of the input terminals being coupled to a fixed reference voltage, the error amplifier being utilized for generating an error signal; and a PWM generator, for determining a duty cycle of the PWM signal according to the error signal.

2. The PWM control circuit of claim 1, wherein the sample and hold circuit samples the sensing voltage for the peak value when the PWM signal is at a high logic level and maintains the peak value of the sensing voltage at the output terminal of the sample and hold circuit when the PWM signal is at a low logic level.

3. The PWM control circuit of claim 1, wherein the feedback voltage is divided via a resistor voltage divider and then coupled to one of the input terminals of the error amplifier.

4. A pulse-width-modulation (PWM) control circuit, being applied to a switching-mode power converter with a primary-side feedback control; the switching-mode power converter including a transformer, a power switch, a current sensing resistor, and the PWM control circuit; the transformer having a primary-side winding, a secondary-side winding, and an auxiliary winding, where a voltage from the auxiliary winding is rectified for outputting a DC feedback voltage; the power switch, connected to the primary-side winding in series, being turned on/off by a PWM signal generated from the PWM control circuit; the current sensing resistor, positioned between the power switch and a ground level, for transforming a current passing through the primary-side winding into a sensing voltage; the PWM control circuit comprising:
  a first sample and hold circuit, for sampling the sensing voltage for a peak value and maintaining the peak value of the sensing voltage at an output terminal of the first sample and hold circuit;
  a second sample and hold circuit, for sampling the sensing voltage for an initial value and maintaining the initial value of the sensing voltage at an output terminal of the second sample and hold circuit;
  an operation processing unit, for subtracting the initial value from the peak value of the sensing voltage to generate an amount of change in the sensing voltage;
  a transconductor circuit, coupled to an output terminal of the operation processing unit, for transforming the amount of change in the sensing voltage into a current signal;
  an error amplifier having two input terminals, one of the input terminals being coupled to the current signal and the feedback voltage and another of the input terminals being coupled to a fixed reference voltage, the error amplifier being utilized for generating an error signal; and
  a PWM generator, for determining a duty cycle of the PWM signal according to the error signal.

5. The PWM control circuit of claim 4, wherein the first sample and hold circuit samples the sensing voltage for the peak value when the PWM signal is at a high logic level and maintains the peak value of the sensing voltage at the output terminal of the first sample and hold circuit when the PWM signal is at a low logic level.

6. The PWM control circuit of claim 4, wherein the second sample and hold circuit comprises a one-shot pulse generation circuit; when the PWM signal changes from the low logic level to the high logic level, the one-shot pulse generation circuit produces a pulse, and the second sample and hold circuit samples the sensing voltage for the initial value according to the pulse and then maintains the initial value of the sensing voltage at the output terminal of the second sample and hold circuit.

7. The PWM control circuit of claim 4, wherein the feedback voltage is divided via a resistor voltage divider and then coupled to one of the input terminals of the error amplifier.

8. A switching-mode power converter with a primary-side feedback control, comprising:
  a transformer, having a primary-side winding, a secondary-side winding, and an auxiliary winding, wherein a voltage from the auxiliary winding is rectified for outputting a DC feedback voltage;
  a power switch, connected to the primary-side winding in series and turned on/off by a PWM signal generated from the PWM control circuit;
  a current sensing resistor, positioned between the power switch and a ground level, for transforming a current passing through the primary-side winding into a sensing voltage;
  a sample and hold circuit, for sampling the sensing voltage for a peak value and maintaining the peak value of the sensing voltage at an output terminal of the sample and hold circuit;
  a transconductor circuit, coupled to the output terminal of the sample and hold circuit, for transforming the peak value of the sensing voltage into a current signal;
  an error amplifier having two input terminals, one of the input terminals being coupled to the current signal and the feedback voltage and another of the input terminals being coupled to a fixed reference voltage, the error amplifier being utilized for generating an error signal; and
  a PWM generator, for determining a duty cycle of the PWM signal according to the error signal.

9. The switching-mode power converter of claim 8, further comprising:
  a resistor voltage divider;
  wherein the feedback voltage is divided via the resistor voltage divider and then coupled to one of the input terminals of the error amplifier.

10. The switching-mode power converter of claim 8, wherein the sample and hold circuit samples the sensing voltage for the peak value when the PWM signal is at a high logic level and maintains the peak value of the sensing voltage at the output terminal of the sample and hold circuit when the PWM signal is at a low logic level.

11. A switching-mode power converter with a primary-side feedback control, comprising:
  a transformer, having a primary-side winding, a secondary-side winding, and an auxiliary winding, wherein a voltage from the auxiliary winding is rectified for outputting a DC feedback voltage;
  a power switch, connected to the primary-side winding in series and turned on/off by a PWM signal generated from the PWM control circuit;
  a current sensing resistor, positioned between the power switch and a ground level, for transforming a current passing through the primary-side winding into a sensing voltage;
  a first sample and hold circuit, for sampling the sensing voltage for a peak value and maintaining the peak value of the sensing voltage at an output terminal of the first sample and hold circuit;
  a second sample and hold circuit, for sampling the sensing voltage for an initial value and maintaining the initial value of the sensing voltage at an output terminal of the second sample and hold circuit;
  an operation processing unit, for subtracting the initial value from the peak value of the sensing voltage to generate an amount of change in the sensing voltage;

a transconductor circuit, coupled to an output terminal of the operation processing unit, for transforming the amount of change in the sensing voltage into a current signal;

an error amplifier having two input terminals, one of the input terminals being coupled to the current signal and the feedback voltage and another of the input terminals being coupled to a fixed reference voltage, the error amplifier being utilized for generating an error signal; and a PWM generator, for determining a duty cycle of the PWM signal according to the error signal.

12. The switching-mode power converter of claim 11, further comprising:

a resistor voltage divider;

wherein the feedback voltage is divided via the resistor voltage divider and then coupled to one of the input terminals of the error amplifier.

13. The switching-mode power converter of claim 11, wherein the first sample and hold circuit samples the sensing voltage for the peak value when the PWM signal is at a high logic level and maintains the peak value of the sensing voltage at the output terminal of the first sample and hold circuit when the PWM signal is at a low logic level.

14. The switching-mode power converter of claim 11, wherein the second sample and hold circuit comprises a one-shot pulse generation circuit; when the PWM signal changes from the low logic level to the high logic level, the one-shot pulse generation circuit produces a pulse, and the second sample and hold circuit samples the sensing voltage for the initial value according to the pulse and maintains the initial value of the sensing voltage at the output terminal of the second sample and hold circuit.

* * * * *